Sept. 29, 1959 C. ROSEN ET AL 2,906,969

CRYSTAL CONTROLLED OSCILLATOR

Filed March 29, 1955

INVENTOR.
CHARLES ROSEN &
CHARLES J. WEIDKNECHT
BY Edward M. Farrell
ATTORNEY 2,906,969
Patented Sept. 29, 1959

2,906,969

CRYSTAL CONTROLLED OSCILLATOR

Charles Rosen and Charles J. Weidknecht, Philadelphia, Pa., assignors to Tele-Dynamics Inc., a corporation of Pennsylvania Application March 29, 1955, Serial No. 497,581

2 Claims. (Cl. 332—26)

This invention relates to crystal controlled oscillators, and more particularly, to crystal controlled oscillators which are capable of being frequency or phase modulated over relatively wide ranges.

Crystal controlled oscillators are characterized by the use of a piezoelectric crystal rather than a tuned circuit as the frequency determining element. The outstanding property of crystal-controlled oscillators is an exceptional degree of frequency stability. The high degree of stability is a direct result of the high "Q" of the crystal unit employed.

Due to its high frequency stability, direct frequency modulation of a crystal controlled oscillator has not been used extensively except where relatively small frequency deviations were desired. In many crystal controlled oscillators, the crystal is employed as means for stabilizing the oscillations within an electrical circuit or for maintaining the carrier or center frequency of an oscillator. In such cases, the crystal acts merely as a control element rather than the effective element of the oscillator.

It is an object of this invention to provide an improved crystal controlled oscillator in which the frequency of the oscillator may be controlled in accordance with a modulating signal.

It is a further object of this invention to provide an improved crystal controlled oscillator wherein the oscillating frequency of a piezoelectric crystal is varied directly in accordance with a modulating signal.

It is still a further object of this invention to provide an improved oscillator circuit wherein the stability of oscillations is maintained when the oscillating frequency of a crystal is varied over relatively wide ranges.

It is still a further object of this invention to provide an improved crystal controlled oscillator applicable to pulse width frequency modulation systems.

In accordance with the present invention, a crystal controlled oscillator includes a piezoelectric element operative in a series resonant mode. A parallel resonant circuit is serially connected to the crystal. Means for sustaining oscillations within the crystal and the parallel resonant circuit are provided. The resonant frequencies of the crystal and the parallel resonant circuit are substantially the same. Means are provided for applying a modulating signal across the parallel resonant circuit. The modulating signal varies the frequency of oscillation of both the crystal and the parallel resonant circuit over a relatively wide range.

Figure 1:
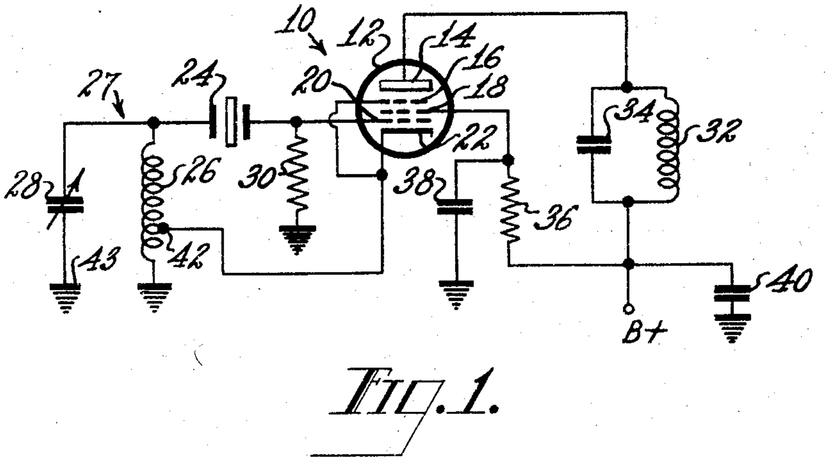
Figure 2:
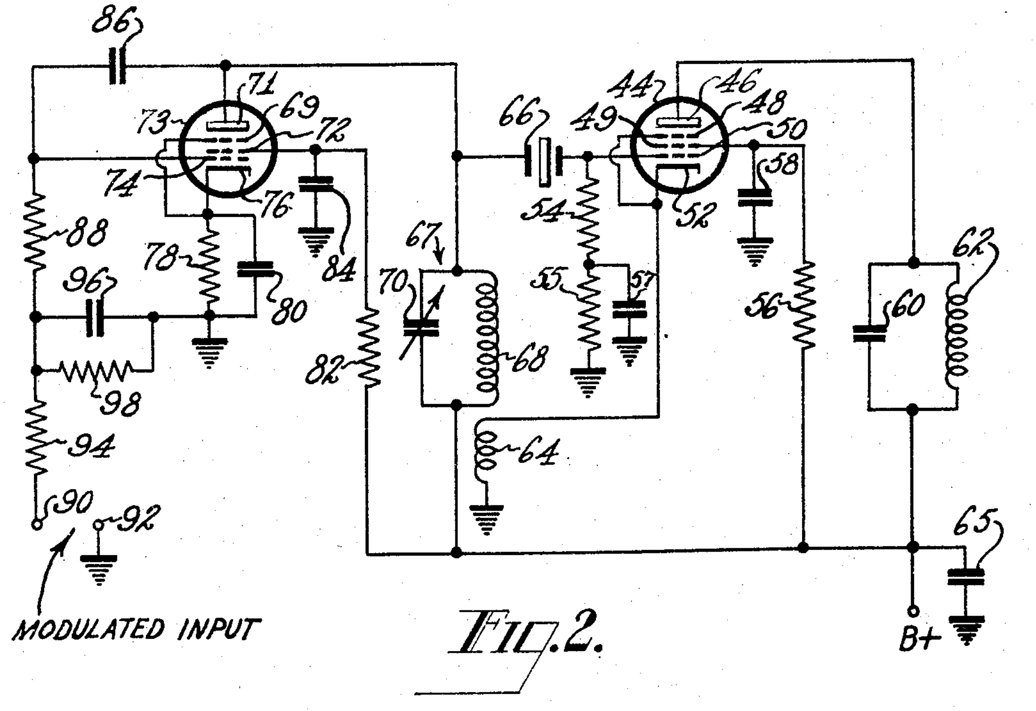

Other objects and advantages of the present invention will be apparent and suggest themselves to those skilled in the art to which the invention is related from a reading of the following specification in connection with the accompanying drawing, in which:

Figure 1 is a schematic circuit diagram of an improved crystal controlled oscillator, in accordance with the present invention, and Figure 2 is a schematic circuit diagram of a modulating circuit associated with an improved crystal controlled oscillator, in accordance with the present invention.

In many applications, a crystal unit comprises a block of crystalline quartz supported between suitable electrodes so as to be useable in an oscillator. The electrodes are usually parallel metal plates close to or touching the faces of the quartz plate, and in many units the metal is actually deposited on the surface of the quartz by vacuum evaporation, cathode sputtering, or chemical reaction. When an alternating electrical voltage is applied to the two terminals of a crystal unit, an alternating electric field is created in the quartz between the electrodes, and a corresponding displacement current flows. Small alternating forces are set up in the volume of the quartz as a result of these displacement currents, but no considerable response occurs unless the electrical frequency corresponds very closely to the frequency of mechanical resonance of the quartz plate. In this event a considerable mechanical vibration occurs, and the current in an external circuit is greatly affected.

Crystals are known to operate in a parallel resonant mode as well as in a series resonant mode. Generally, at some frequency higher than the series resonant frequency of a crystal, the combined effective reactance of L and C will become inductive. The two metal plates, or electrodes attached to the crystal, in effect, form a capacitor separated by the crystal dielectric. When the combined effective reactance of L and C is inductive and is equal to the capacitive reactance of the capacitor formed by the two plates, the crystal will operate in a parallel resonant mode. At the resonant frequency of the parallel resonant mode of operation, the impedance of the crystal will be maximum.

Although quartz has been used extensively as the crystal element for crystal controlled oscillators, many other elements exhibiting piezoelectric effects may be employed, such as Rochelle salts or tourmaline. The type element and the cut of crystal used is determined by particular circuit requirements as well as the environmental condition under which the crystal will operate.

When a crystal is operating in a series resonant mode, its frequency response characteristic is relatively sharp due to its high "Q." If a series resistance is added to the crystal operating in a series resonant mode, the effective "Q" of the crystal circuit will decrease. When this occurs, the frequency response characteristic of the crystal become relatively uniform over a wide range of frequencies.

Likewise, if a crystal is operating in a series resonant mode and is serially connected to a parallel tank circuit, the "Q" of the crystal will be effectively reduced if the tank circuit is tuned to the same frequency as the crystal. The reason for the lowering of the "Q" of the crystal is that the resistance of the tank circuit at resonance is in series with the resistance of the crystal thereby lowering the "Q" of the crystal.

It is seen that when the "Q" of a crystal is reduced as stated above, an oscillator employing a crystal operating in its series resonant mode and a parallel resonant tank circuit serially connected thereto, may provide a circuit especially suitable for frequency or phase modulation, as will be seen. A resistor associated with the circuit within which the crystal operates will further effectively lower the "Q" of the crystal to a desired value.

Referring now to Figure 1, there is shown schematically a circuit embodying the present invention. A crystal controlled oscillator 10 includes an electron discharge device 12, in the form of a pentode tube, comprising an anode 14, a suppressor grid 16, a screen grid 18, a control grid 20 and a cathode 22. An input circuit connected across the control grid 20 and the cathode 22 includes a crystal element 24 and a parallel resonant circuit 27 having an inductor 26 and a capacitor 28. The crystal element 24 is serially connected between the parallel resonant circuit and the control grid 20. A resistor 30 provides means for biasing the electronic discharge tube during operation as well as providing additional damping means for effectively lowering the "Q" of the crystal. The anode 14 is connected to a suitable source of operating potential, designated as B+, through a resonant circuit having an inductor 32 and a capacitor 34 connected in parallel. The screen grid 18 is connected to B+ through a voltage dropping resistor 36. A capacitor 38 provides a signal path for the screen circuit and a capacitor 40 provides a signal path for the anode or output circuit. The cathode 22 is connected to a tap 42 on the inductor 26 to provide means for feeding back a portion of the signal from the output circuit to the input circuit to sustain oscillations within the crystal controlled oscillator. The suppressor grid 16 is directly connected to the cathode 22.

Basically this circuit operates as a modified Hartley oscillator with a crystal acting as a frequency selective filter between the tank circuit and the grid.

As in many fundamental oscillator circuits, amplified energy in the anode or output circuit is fed back to the grid or input circuit by means of inductive coupling. A single inductor 26 is used with the portion of the inductor between the tap 42 and a point of reference potential 43 being in the plate circuit. Hereinafter the point of reference potential will be designated as ground. The amount of signal feedback from the anode circuit to the grid circuit is controlled by position of the tap which determines the number of turns of the inductor 26 in the anode circuit. The alternating current in the portion of the inductor which is in the anode circuit induces a voltage in the remaining portion of the inductor 26 which is in the grid circuit. The voltage induced in the grid circuit maintains oscillations in the parallel resonant circuit 27, as well as within the crystal element.

The parallel resonant circuit comprising the inductor 32 and the capacitor 34 may be tuned to a desired harmonic of the oscillator frequency to provide a frequency multiplication circuit. Such a frequency multiplication circuit is well know and is often used to exclude the fundamental frequency and other undesired harmonics in an output circuit.

In practicing the invention, the crystal 24 is operative in its series resonant mode. The frequency of oscillation of the crystal 24 and the parallel resonant circuit 27 is substantially the same. Since the parallel resonant circuit is serially connected to the crystal 24 in the input circuit, the "Q" of the crystal is effectively lowered thereby permitting the crystal to operate over a relatively wide band of frequencies rather than at a single or very narrow band of frequencies. The resistor 30 connected between one terminal of the crystal 24 and ground further effectively lowers the "Q" of the crystal. Thus the crystal is adapted to be frequency or phase modulated over a relatively wide range of frequencies while still maintaining its stability. One way of frequency modulating the oscillator 10 is to connect a reactance circuit across the parallel resonant circuit 27 and vary the characteristic of the reactance circuit in accordance with a modulating signal.

It is noted that the oscillator circuit shown is capable of oscillating at two frequencies when the grid tank circuit is tuned, such as by varying the capacitor 28. At one of these frequencies, when the crystal is operated in its series resonant mode, the oscillator circuit is subject to frequency modulation. At the other frequency, on the other hand, when the crystal is operating in its parallel resonant mode, the oscillation of the oscillator circuit is solid and is difficult to modulate. However, since the theory underlying this invention relates to effectively lowering of the "Q" of a crystal, it is possible that the crystal may be operated at its parallel resonant mode if enough phase cancellation is obtained from a high "Q" series resonant circuit serially connected to the crystal. Such an arrangement would lower the "Q" of the crystal, thereby making it subject to modulation over a relatively wide range of frequencies.

Referring now to Figure 2, a crystal controlled oscillator embodying the present invention is shown schematically, together with circuit means for frequency or phase modulating the oscillator.

The oscillator is substantially similar to the oscillator shown and described in connection with Figure 1. A pentode tube 44 includes an anode 46, a suppressor grid 48, a screen grid 49, a control grid 50 and a cathode 52. A crystal 66 and a parallel resonant circuit 67 comprising an inductor 68 and a capacitor 70 are included in the grid or input circuit. A grid leak resistor 54 is provided for loading the crystal 66 to effectively lower its "Q." A resistor 55 and a capacitor 57 are included in the grid circuit to provide biasing means for the oscillator during operation. A voltage dropping resistor 56 and a by-pass capacitor 58 are included in the screen circuit. A parallel tank circuit comprising a capacitor 60 and an inductor 62 is included in the anode circuit and may be tuned to an harmonic of the oscillating frequency to attain frequency multiplication. The cathode 52 is connected to ground through a tickler coil 64, which provides the means for feeding back a portion of the voltage from the output to the input circuit to sustain oscillations within the parallel resonant circuit 67 and the crystal 66. The suppressor grid 48 is directly connected to the cathode 52. The anode circuit of the pentode 44 is connected to B+ and a capacitor 65 provides a signal path for the anode current.

A variable reactance circuit is connected across the parallel resonant circuit 67 of the oscillator and provides the means for frequency or phase modulating the oscillator in accordance with a modulating signal.

The reactance circuit comprises a reactance pentode tube 73 having an anode 71, a suppressor grid 69, a screen grid 72, a control grid 74 and a cathode 76. A resistor 78 and a capacitor 80 provide self biasing means for the pentode tube during operation. A resistor 82 and a by-pass capacitor 84 are included in the screen grid circuit. The suppressor 69 is connected directly to the cathode 76. A capacitor 86 and a resistor 88 provide a phase shifting network. Input terminals 90 and 92 are provided to receive a modulating signal, which may, for example, be a voltage of varying amplitude. The modulating signal is applied through a coupling resistor 94 across the input circuit of the pentode tube. A capacitor 96 and a resistor 98 provide a filter network for the modulating signal.

The operation of the crystal controlled oscillator is substantially the same as the oscillator illustrated and described in connection with Figure 1. The crystal 66 is operative in its series resonant mode. The parallel circuit 67 is serially connected to the crystal 66 and acts to damp the resonant peak of the crystal by effectively lowering its "Q." The resistor 54 further lowers the effective "Q" of the crystal. The crystal, under these conditions, has a relatively flat response over a relatively wide range of frequencies. The crystal may, therefore, be frequency or phase modulated over a relatively wide range while still maintaining its inherent stability. The additional resistor 55 and the capacitor 57 are included in the grid circuit of the oscillator so that the crystal loading by the resistor 54 and the value of the bias voltage as determined by the resistor 55 and the capacitor 57 may be adjusted independently of each other. The use of a single resistor, such as the resistor 30 shown in Figure 1 makes such independent adjustment of the loading and the bias difficult to attain.

The reactance circuit comprising the reactance tube 73 is connected across the parallel resonant circuit 67. In the embodiment of the invention shown a varying direct current voltage, such as may be applied to the terminals 90 and 92, is connected to the grid 74 to cause a variation in current flow in the anode circuit of the pentode or reactance tube 73. Due to the phase shifting network, comprising the capacitor 86 and the resistor 88, the variation in current flow, in effect, causes a variation in capacitive reactance of the output circuit of the reactance tube 73. Since the reactance tube is connected across the parallel circuit 67 of the crystal controlled oscillator, the varying capacitive reactance will cause the resonant frequency of oscillation of the circuit 67 to shift. Thus, it is seen that the modulating signal applied to the terminals 90 and 92 frequency modulates the oscillator. It is noted that when the frequency of the parallel resonant circuit 67 changes frequency, the frequency of oscillation of the crystal 66 also changes frequency. Thus direct frequency or phase modulation of a crystal is attained through the use of the present invention. This modulation is attainable over a relatively wide frequency range.

In considering the operation of this circuit, the input circuit to the oscillator tube may be regarded as a combined impedance or reactance including the impedance or reactance of the crystal and the impedance or reactance of the parallel resonant circuit. Varying the impedance or reactance of the parallel resonant circuit, such as by applying a varying reactance thereacross, results in a change of the combined or total impedance. This change results in an overall resonant frequency shift within the input circuit of the oscillator.

Numerous variations in the reactance circuit employed are possible. For example, the circuit may be modified so as to comprise an inductive reactance rather than a capacitive reactance, such as described. Other circuits, other than reactance tubes, which will frequency modulate the oscillator when connected across the parallel circuit of the oscillator may also be employed. For example, an actual capacitor or inductor may be shunted across the parallel resonant circuit of the oscillator, with its value varied to change the total reactance of the tuned circuit of the oscillator.

In some circuits it may be desirable to associate a bridge or other type network with the crystal to neutralize the capacitance formed by the two electrodes of the crystal. Such neutralization will reduce the tendency of the crystal to oscillate in its parallel or ante resonant mode.

It is noted that the present invention has provided a relatively simple circuit in which distortion or nonlinearity may be easily compensated for by simple modifications of the circuit associated with the reactance tube or other modulating means. In the systems wherein linearity between the plate circuit reactance of a reactance tube and the output frequency of the oscillator is of prime importance, such compensation is necessary and easily attained with the oscillator circuit embodying the present invention. Some systems, however, do not require absolute linearity or freedom from distortion.

Many systems presently in use, such as those employing pulse width frequency modulation employed in airborne equipment for telemetering purposes, permit some distortion or non-linearity without affecting the efficiency or reliability of the system. In such systems, circuits embodying the present invention may be advantageously employed without additional circuitry to compensate for non-linearity or distortion.

By suitable modification of the circuits shown transistors having a receiver, emitter and controller of electrons may be substituted for the pentode tubes shown. Also, the use of tubes, other than pentodes, is possible.

Thus it is seen that the present invention has provided a relatively simple circuit in which a crystal controlled oscillator may be directly frequency or phase modulated. The modulation is attainable over relatively ranges while at the same time the advantages or stability that a crystal controlled oscillator offers are maintained. The circuit embodying the present invention employs a minimum number of parts and is especially adaptable for equipment where size and weight is an important factor, such as in air-borne telemetering equipment.

What is claimed is:

1. A high frequency modulated crystal controlled oscillator comprising an electron discharge device, an input circuit to said electron discharge device, a piezoelectric crystal operative in a series resonant mode included in said input circuit, a parallel resonant circuit serially connected to said piezoelectric crystal in said input circuit to effectively lower the "Q" of said piezoelectric crystal, the resonant frequencies of said piezoelectric crystal and said parallel resonant circuit being substantially the same, a first resistive means included in said input circuit for further effectively lowering the "Q" of said crystal whereby said piezoelectric crystal acts as a mechanical bandpass filter in said input circuit, an output circuit for said electron discharge device, means for applying a source of operating potential to said electron discharge device, a second resistive means serially connected with said first resistive means for biasing said electron discharge device during operation, high frequency by-pass means connected between said first and second resistive means whereby the values of each of said resistive means may be independently chosen, inductive feedback means to couple a portion of said output circuit to said input circuit to generate sustained electrical oscillations in said piezoelectric crystal and said resonant circuit, a variable reactance circuit connected across said parallel resonant circuit, and means for applying a modulating signal to variable reactance circuit to vary the reactance thereof whereby the resonant circuit is changed thereby changing the frequency of said crystal controlled oscillator.

2. A high frequency electrical oscillator circuit comprising a vacuum tube including at least an anode, a cathode and a control grid, an input circuit connected across said grid and said cathode, a mechanical bandpass filter comprising a piezoelectric crystal operative in a series resonant mode included in said input circuit, a resonant circuit having a capacitor and an inductor connected in parallel relationship, said resonant circuit being serially connected to said mechanical filter in said input circuit, said mechanical filter being connected between said resonant circuit and said grid, the resonant frequencies of said mechanical filter and said resonant circuit being substantially the same, a resistor connected between said grid and said cathode for negatively biasing said grid with respect to said cathode during the operation of said oscillator, an additional resistor and a capacitor connected between said grid and said cathode to provide a loading for said piezoelectric crystal to effectively lower the "Q" thereof, said capacitor providing a by-pass for high frequency signals, an output circuit connected across said anode and said cathode of said vacuum tube, a parallel resonant circuit connected in said output circuit, said parallel resonant circuit being tuned to a multiple frequency of said resonant frequency of said mechanical filter and said resonant circuit in said input circuit, means for applying a source of operating potential to said electron discharge device, inductive feedback means to couple said output circuit to said input circuit to generate sustained oscillations in said mechanical filter and said resonant circuit, a variable reactance circuit connected across said resonant circuit, and means for applying a modulating signal to said variable reactance circuit to vary the reactance thereof whereby the resonant frequency of said resonant circuit is changed thereby changing the frequency of said oscillator in accordance with said modulating signal.

References Cited in the file of this patent

UNITED STATES PATENTS 1,975,603 Hansell ---------------- Oct. 2, 1934

(Other references on following page)

UNITED STATES PATENTS

| | | |
|---|---|---|
| 2,298,438 | Usselman | Oct. 13, 1942 |
| 2,426,295 | Born | Aug. 26, 1947 |
| 2,438,392 | Gerber | Mar. 23, 1948 |
| 2,455,824 | Tellier et al. | Dec. 7, 1948 |
| 2,703,387 | Dutton | Mar. 1, 1955 |
| 2,757,288 | Jacobsen | July 31, 1956 |
| 2,774,943 | Watson | Dec. 18, 1956 |

FOREIGN PATENTS

| | | |
|---|---|---|
| 621,255 | Germany | Oct. 17, 1935 |